US006999737B2

(12) United States Patent
Ishihara

(10) Patent No.: US 6,999,737 B2
(45) Date of Patent: Feb. 14, 2006

(54) WIRELESS TRANSMITTER AND DEVICE FOR MOBILE STATION

(75) Inventor: Takeshi Ishihara, Tokyo (JP)

(73) Assignee: NEC Corporation, Tokyo (JP)

( * ) Notice: Subject to any disclaimer, the term of this patent is extended or adjusted under 35 U.S.C. 154(b) by 484 days.

(21) Appl. No.: 10/193,253

(22) Filed: Jul. 12, 2002

(65) Prior Publication Data

US 2003/0013427 A1 Jan. 16, 2003

(30) Foreign Application Priority Data

Jul. 12, 2001 (JP) .............................. 2001-212011

(51) Int. Cl.
*H01Q 11/12* (2006.01)
*H04B 1/04* (2006.01)
(52) U.S. Cl. ................ 455/126; 455/127.1; 455/115.1; 455/69
(58) Field of Classification Search ................ 455/126, 455/127.1, 127.2, 127.3, 127.5, 115.1, 69, 455/522, 232.1, 240.1, 250.1, 116
See application file for complete search history.

(56) References Cited

U.S. PATENT DOCUMENTS 5,172,071 A 12/1992 Braathen .................... 330/129

| 6,337,974 | B1 |   | 1/2002 | Inamori et al. |
|-----------|----|---|--------|----------------|
| 6,373,902 | B1 | * | 4/2002 | Park et al. ................... 375/296 |
| 6,384,677 | B1 | * | 5/2002 | Yamamoto ................... 455/126 |
| 6,463,264 | B1 | * | 10/2002 | Obara ..................... 455/127.2 |
| 6,466,628 | B1 | * | 10/2002 | Kim ........................... 455/126 |
| 6,526,266 | B1 | * | 2/2003 | Obara ........................ 455/126 |

FOREIGN PATENT DOCUMENTS

| CN | 1275874 | 12/2000 |
|----|---------|---------|
| EP | 1058405 | 12/2000 |
| JP | 9-23125 | 1/1997 |

* cited by examiner

*Primary Examiner*—Nay Maung
*Assistant Examiner*—John J. Lee
(74) *Attorney, Agent, or Firm*—Young & Thompson

(57) ABSTRACT

A wireless transmitter has: a calculation means for determining an electric power value of baseband signals to be input to modulating means; a detection means for determining a transmitting electric power value after detecting a transmitting electric power of an antenna; a generation means for generating target gains of a plurality of variable gain amplifying means; and a control means for determining observation gains from the electric power value and the transmitting electric power value to control the gains of the plurality of variable gain amplifying means in such that the observation gains come to be the target gains.

6 Claims, 3 Drawing Sheets

WIRELESS TRANSMITTER AND DEVICE FOR MOBILE STATION

FIELD OF THE INVENTION

The present invention relates to a wireless transmitter used for a transmitting means such as cellular phone in a mobile communication system, and particularly to a wireless transmitter by which a transmitting electric power, which varies in response to environmental changes such as ambient temperature variation and the like, can be controlled in a constant state as well as to a device for mobile station provided with such wireless transmitter.

BACKGROUND OF THE INVENTION

A conventional wireless transmitter having a function for controlling its transmitting electric power in a constant state is shown in FIGS. 1 and 2 with which an explanation therefor will be made.

FIG. 1 is a block diagram showing a constitution of a conventional first wireless transmitter wherein the wireless transmitter 200 has a function for controlling its transmitting electric power in a constant state by means of automatic level control (ALC) and which comprises a baseband transmission signal generating section 101, a baseband filter 102, a D/A converter 103, a quadrature modulator 104, a first local oscillator 105, a first variable gain amplifier 106, a first bandpass wave filter 107, a frequency converter 108, a second local oscillator 109, a second bandpass wave filter 110, a second variable gain amplifier 111, a third bandpass wave filter 112, a transmission amplifier 113, an isolator 114, a high-frequency coupler 115, an antenna sharer 116, an antenna 117, a high-frequency detector 118, an A/D converter 119, a variable gain amplifier control signal generator 120, and a target gain control signal generating section 121.

The wireless transmitter 200 provided with components 101 through 121 is classified broadly into a wireless transmitting means composed of the components 101 through 117 and a transmitting electric power control means composed of the components 118 through 121.

In the wireless transmitting means, the baseband transmission signal generating section 101, the baseband filter 102, and the D/A converter 103 are connected by baseband signal lines involving I-channel and Q-channel components (hereinafter simply referred to as "I- and Q-components") with each other. Input ends of the quadrature modulator 104 are connected to baseband signal output ends involving I- and Q-components of the D/A converter 103 and an output end of the first local oscillator 105. An intermediate frequency output end of the quadrature modulator 104 is connected to an intermediate frequency input end of the frequency converter 108 through the first variable gain amplifier 106 and the first bandpass wave filter 107.

A radio frequency input end of the frequency converter 108 is connected to an output end of the second local oscillator 109, while a radio frequency output end of the frequency converter 108 is connected to an input end of the antenna 117 through the second bandpass wave filter 110, the second variable gain amplifier 111, the third bandpass wave filter 112, the transmission amplifier 113, the isolator 114, the high-frequency coupler 115, and the antenna sharer 116.

Furthermore, in the wireless transmitting means, an input end of the high-frequency detector 118 is connected with an output end for high-frequency detection of the high-frequency coupler 115, while an output end of the high-frequency detector 118 is connected with a transmitting electric power signal input end of the variable gain amplifier control signal generator 120 through the A/D converter 119.

A target gain signal input end of the variable gain amplifier control signal generator 120 is connected with an output end of the target gain control signal generating section 121, an intermediate frequency gain control signal output end of the variable gain amplifier control signal generator 120 is connected with a gain amplifying conversion signal input end of the first variable gain amplifier 106, and a radio frequency gain control signal output end thereof is connected with a gain amplifying conversion signal input end of the second variable gain amplifier 111.

In the following, functions of the respective components 101 through 121 are described.

The baseband transmission signal generating section 101 generates a transmission signal transmitted from the present wireless transmitter 200. The baseband filter 102 applies bandwidth limiting to a transmission signal (digital signal) from the baseband transmission signal generating section 101. The D/A converter 103 converts digital signals passed through the baseband filter 102 into analog signals.

The quadrature modulator 104 functions to frequency-convert transmission signals of baseband bandwidth from the D/A converter 103 into transmission signals of intermediate frequency bandwidth, and further to quadrature-modulate the transmission signals thus frequency-converted.

The first local oscillator 105 outputs local oscillation signal used in the quadrature modulator 104. The first variable gain amplifier 106 controls gains in response to intermediate frequency gain control signals from the variable gain amplifier control signal generator 120, thereby to amplify transmission signals from the quadrature modulator 104.

The first bandpass wave filter 107 passes through only those of intermediate frequency bandwidth among transmission signals from the first variable gain amplifier 106.

The frequency converter 108 frequency-converts the transmission signals in intermediate frequency bandwidth passed through the first bandpass wave filter 107 into those of radio frequency bandwidth.

The second local oscillator 109 outputs local oscillation signal used in the frequency converter 108. The second bandpass wave filter 110 passes through only transmission signals in radio transmission bandwidth.

The second variable gain amplifier 111 controls gains in response to radio frequency gain control signals from the variable gain amplifier control signal generator 120 to amplify transmission signals in radio transmission bandwidth passed through the second bandpass wave filter 110. The third bandpass wave filter 112 passes through only the transmission signals of radio transmission bandwidth from the second variable gain amplifier 111. The transmission amplifier 113 amplifies the transmission signals of radio transmission bandwidth passed through the second variable gain amplifier 111 to a predetermined transmitting electric power.

The isolator 114 passes through transmission signals in only a direction from the transmission amplifier 113 to the high-frequency coupler 115, while it prevents to pass through the signals in the reverse direction. The high-frequency coupler 115 takes out transmission signals in a front end of the wireless transmitter 200.

The high-frequency detector 118 detects an output electric power of the transmission signals from the high-frequency coupler 115. The A/D converter 119 converts an analog value of the electric power of the transmission signals detected in the high-frequency detector 118 into a digital value (a value of output electric power) thereof.

The variable gain amplifier control signal generator 120 is a component wherein gains of the first and second variable gain amplifiers 106 and 111 are set so as to be target gains in response to target gain control signals from the target gain control signal generating section 121 at the time of starting transmission, and signals for controlling gains of the first and second variable gain amplifiers 106 and 111 are generated in such that a value of output electric power from the A/D converter 119 comes to be constant at the time of subsequent transmission. The target gain control signal generating section 121 generates target gain control signals for setting target gains.

In the following, operations of the wireless transmitter 200 having such constitution as described above are described.

At the time of starting transmission, gains of the first and second variable gain amplifiers 106 and 111 are set so as to be target gains in response to target gain control signals from the target gain control signal generating section 121 in the variable gain amplifier control signal generator 120.

Then, baseband transmission signals of I- and Q-components generated in the baseband transmission signal generating section 101 are input to the quadrature modulator 104 through the baseband filter 102 and the D/A converter 103 wherein the baseband transmission signals thus input are subjected to frequency conversion into transmission signals of intermediate frequency bandwidth in response to local oscillation signals from the first local oscillator 105, and further the signals thus converted are subjected to quadrature modulation.

The transmission signals in intermediate frequency bandwidth are amplified by the first variable gain amplifier 106 target gains of which have been set at the time of starting transmission, the signals amplified are filtered by the first bandpass wave filter 107, and then, they are frequency-converted by means of the frequency converter 108 into transmission signals of radio frequency bandwidth in response to local oscillation signals from the second local oscillator 109.

The transmission signals of radio frequency bandwidth are filtered by the second bandpass wave filter 110, the signals thus filtered are amplified by the second variable gain amplifier 111 target gains of which have been set at the time of starting transmission, then, the amplified signals are filtered by the third bandpass wave filter 112, and the signals filtered are amplified by the transmission amplifier 113. The resulting amplified transmission signals are transmitted wirelessly from the antenna 117 to, for example, a base station (not shown) through the isolator 114, the high-frequency coupler 115, and the antenna sharer 116.

A transmitting electric power transmitted from the antenna 117 is detected by the high-frequency detector 118 through the high-frequency coupler 115, an analog value of an electric power of the transmission signals thus detected is converted into a digital value (a value of output electric power), and the value is input to the variable gain amplifier control signal generator 120. From the variable gain amplifier control signal generator 120, intermediate frequency gain control signals are output to the first variable gain amplifier 106 and radio frequency gain control signals are output to the second variable gain amplifier 111 in such that the output electric power value becomes constant, whereby transmitting electric power is controlled at a constant value.

FIG. 2 is a block diagram showing a constitution of a conventional second wireless transmitter wherein like or corresponding components of FIG. 1 are designated by the same reference characters in FIG. 2 and the description therefor is omitted.

A wireless transmitter 300 shown in FIG. 2 has a function to control a transmitting electric power at a constant value even in a case when temperature changes. The wireless transmitter 300 is composed of a variable gain amplifier control signal generator 122, a temperature sensor 123, and an A/D converter 124 other than the following components, which have been described with respect to FIG. 1, i.e., a baseband signal generating section 101, a baseband filter 102, a D/A converter 103, a quadrature modulator 104, a first local oscillator 105, a first variable gain amplifier 106, a first bandpass wave filter 107, a frequency converter 108, a second local oscillator 109, a second bandpass wave filter 110, a second variable gain amplifier 111, a third bandpass wave filter 112, a transmission amplifier 113, an isolator 114, an antenna sharer 116, an antenna 117, and a target gain control signal generating section 121.

The temperature sensor 123 detects ambient temperatures. The A/D converter 124 converts an analog amount of temperature detected by the temperature sensor 123 into a digital amount (a temperature value). In the variable gain amplifier control signal generator 122, gains of the first and second variable gain amplifiers 106 and 111 are set so as to become target gains in response to target gain control signals from the target gain control signal generating section 121 at the time of starting transmission.

Furthermore, the variable gain amplifier control signal generator 122 maintains a table wherein temperature values are allowed to correspond to gains in a memory, retrieves gains corresponding to temperature values from the A/D converter 119 at the time of starting transmission, and generates a signal for controlling gains of the first and second variable gain amplifiers 106 and 111 in such that they coincide with the gains retrieved.

In the following, operations of the wireless transmitter 300 having the above-described constitution are described.

At the time of starting transmission, gains of the first and second variable gain amplifiers 106 and 111 are set to target gains in the variable gain amplifier control signal generator 120 in response to a target gain control signals from the target gain control signal generating section 121.

Then, baseband transmission signals of I- and Q-components generated in the baseband transmission signal generating section 101 are input to the quadrature modulator 104 through the baseband filter 102 and the D/A converter 103 wherein the signals are frequency-converted into transmission signals of intermediate frequency bandwidth, and further they are quadrature-modulated in response to local oscillation signals from the first local oscillator 105.

The transmission signals of intermediate frequency bandwidth are amplified in the first variable gain amplifier 106 wherein target gains have been set at the time of starting transmission, the signals thus amplified are filtered by the first bandpass wave filter 107, and then, the signals filtered are frequency-converted into transmission signals in radio frequency bandwidth in response to local oscillation signals from the second local oscillator 109.

The transmission signals of radio frequency bandwidth are filtered by the second bandpass wave filter 110, the signals thus amplified are in the second variable gain amplifier 111 wherein target gains have been set at the time of starting transmission, then, the signals amplified are filtered by the third bandpass wave filter 112, and the signals thus filtered are amplified in the transmission amplifier 113. The amplified transmission signals are transmitted wirelessly from the antenna 117 to, for example, a base station through the isolator 114, and the antenna sharer 116.

In case of the transmission, an ambient temperature is detected by the temperature sensor 123, an analog amount of the temperature thus detected is converted into a digital value (temperature value) by means of the A/D converter 124, and the resulting value is input to the variable gain amplifier control signal generator 122.

In the variable gain amplifier control signal generator 122, gains corresponding to the temperature values input are retrieved from a table, and gains of the first and second variable gain amplifiers 106 and 111 are controlled in such that they come to be the gains retrieved. The control is conducted in accordance with a step wherein intermediate frequency gain control signals are output to the first variable gain amplifier 106, and a step wherein radio frequency gain control signals are output to the second variable gain amplifier 111.

According to such constitution as described above, transmitting electric power is maintained at a constant value even in a case where ambient temperature varies.

In the meantime, for the sake of suppressing electric power consumption in recent years, a conventional wireless transmitter has been adapted to apply such a technique that if there is no signal to be transmitted in spite of connection of radio link, for example, there is no conversation during phone call, no audio data is transmitted.

In this case, since no audio data is transmitted, the whole level of a transmission output decreases. However, it is desired that a level of control data is constant irrespective of ON/OFF of such audio data.

In this respect, however, a conventional ALC in the wireless transmitter 200 shown in FIG. 1 operates in such that even level changes due to ON/OFF of audio data are compensated, and a level in control data is amended also at the time of the compensation. Accordingly, there is such a problem that a level of control data cannot be maintained at a constant value.

On the other hand, there is such a constitution that the wireless transmitter 300 shown in FIG. 2 is provided with the temperature sensor 123 to compensate temperature changes for the sake of stabilizing output electric power with respect to such temperature changes.

In this case, however, it is required to prepare a table for compensation of temperature. Besides, it is also required to operate adjustments in preparation of a table for temperature compensation in each transmitter in order to control correctly data, because there are individual specificities in temperature sensors 123 and heat sources. Thus, there is a problem of troublesome man-hours for the preparation.

SUMMARY OF THE INVENTION

In view of the above-described problems involved in the prior art, the present invention has been made.

Accordingly, an object of the present invention is to provide a wireless transmitter by which a transmitting electric power in a control channel can be maintained at a constant value irrespective of ON/OFF of an information channel of sounds and the like, and further, a transmitting electric power can be held at a constant value in case of temperature changes without use of any temperature detecting means.

Another object of the present invention is to provide a device for mobile station provided with the above-described wireless transmitter.

In order to solve the above-described problems, a wireless transmitter of the present invention wherein baseband transmission signals of I- and Q-components are amplified by a plurality of variable gain amplifying means via a modulating means for effecting digital/analog conversion and quadrature modulation of the baseband transmission signals, and then, the resulting signals are transmitted from an antenna, comprises a calculation means for determining an electric power value of the baseband signals to be input to the modulating means; a detection means for determining a transmitting electric power value after detecting a transmitting electric power of the antenna; a generation means for generating target gains of the plurality of variable gain amplifying means; and a control means for determining observation gains from the electric power value and the transmitting electric power value to control the gains of the plurality of variable gain amplifying means in such that the observation gains come to be the target gains.

Furthermore, a device for mobile station of the present invention comprises a wireless transmitter as described above.

BRIEF DESCRIPTION OF THE DRAWINGS

The present invention will be explained in more detail in conjunction with appended drawings, wherein.

DESCRIPTION OF THE PREFERRED EMBODIMENT

In the following, a preferred embodiment of the present invention will be described in detail in conjunction with the accompanying drawings.

Figure 1:
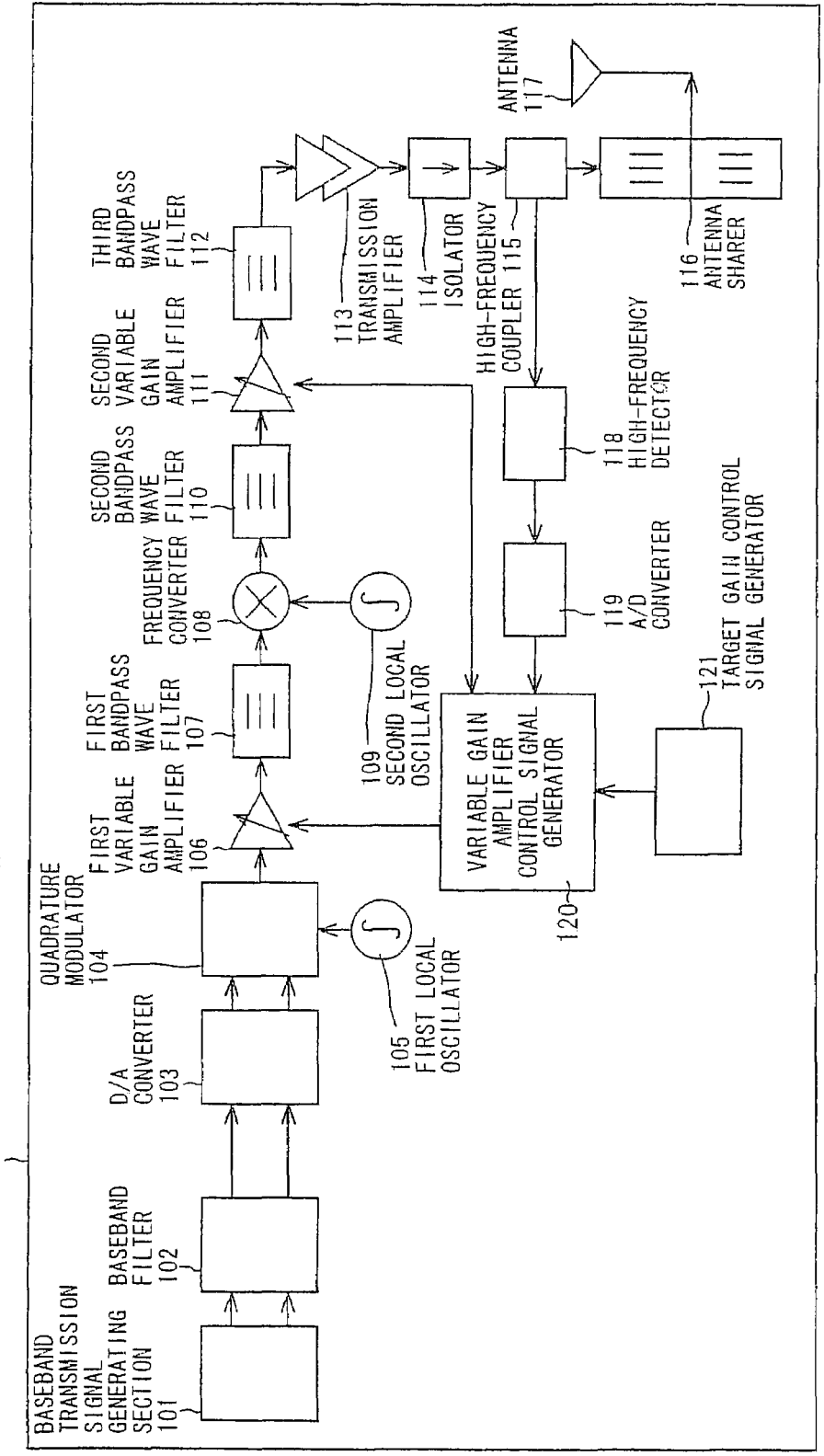
FIG. 1 is a block diagram showing a constitution of a conventional first wireless transmitter.
Figure 2:
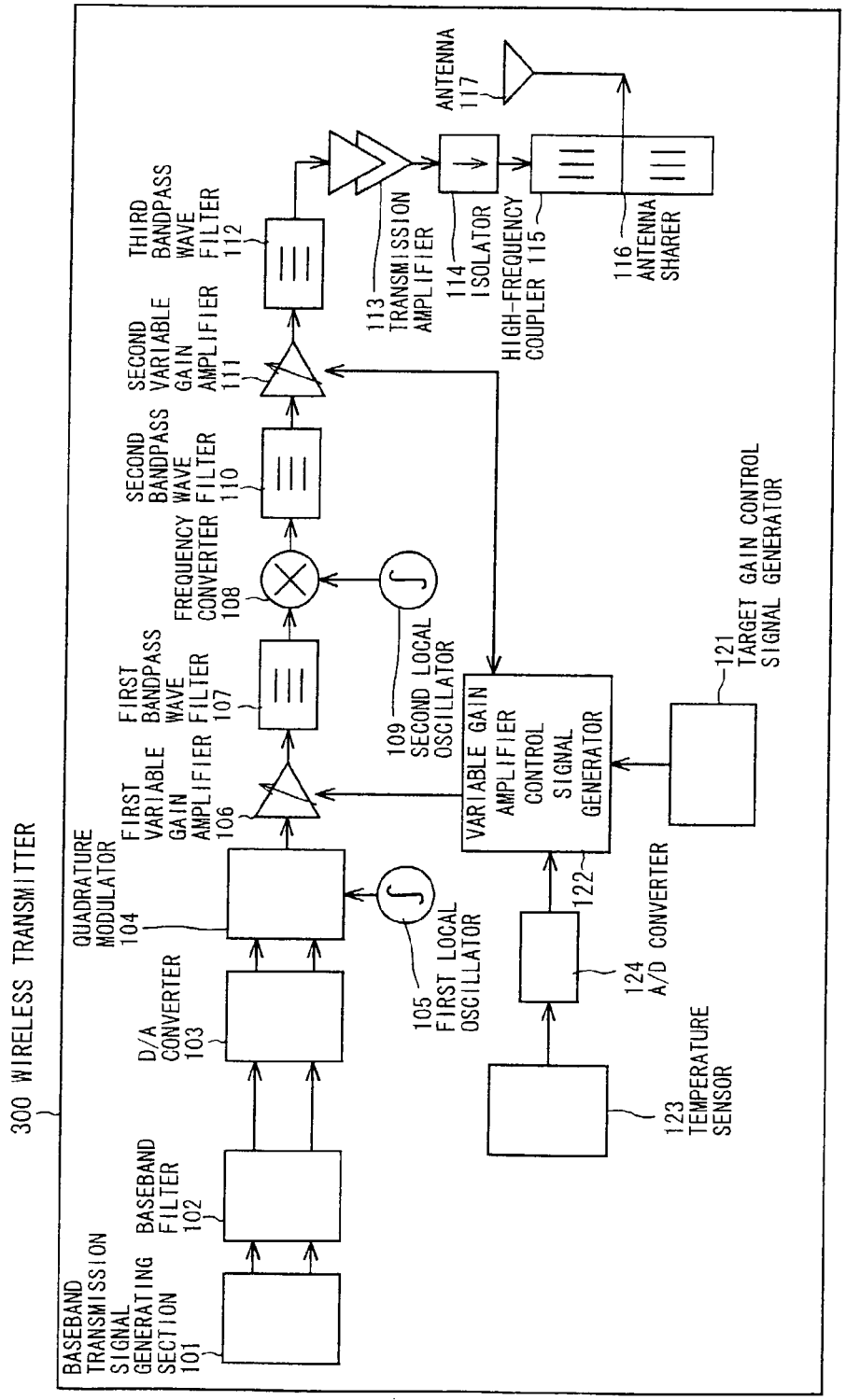
FIG. 2 is a block diagram showing a constitution of a conventional second wireless transmitter.
Figure 3:
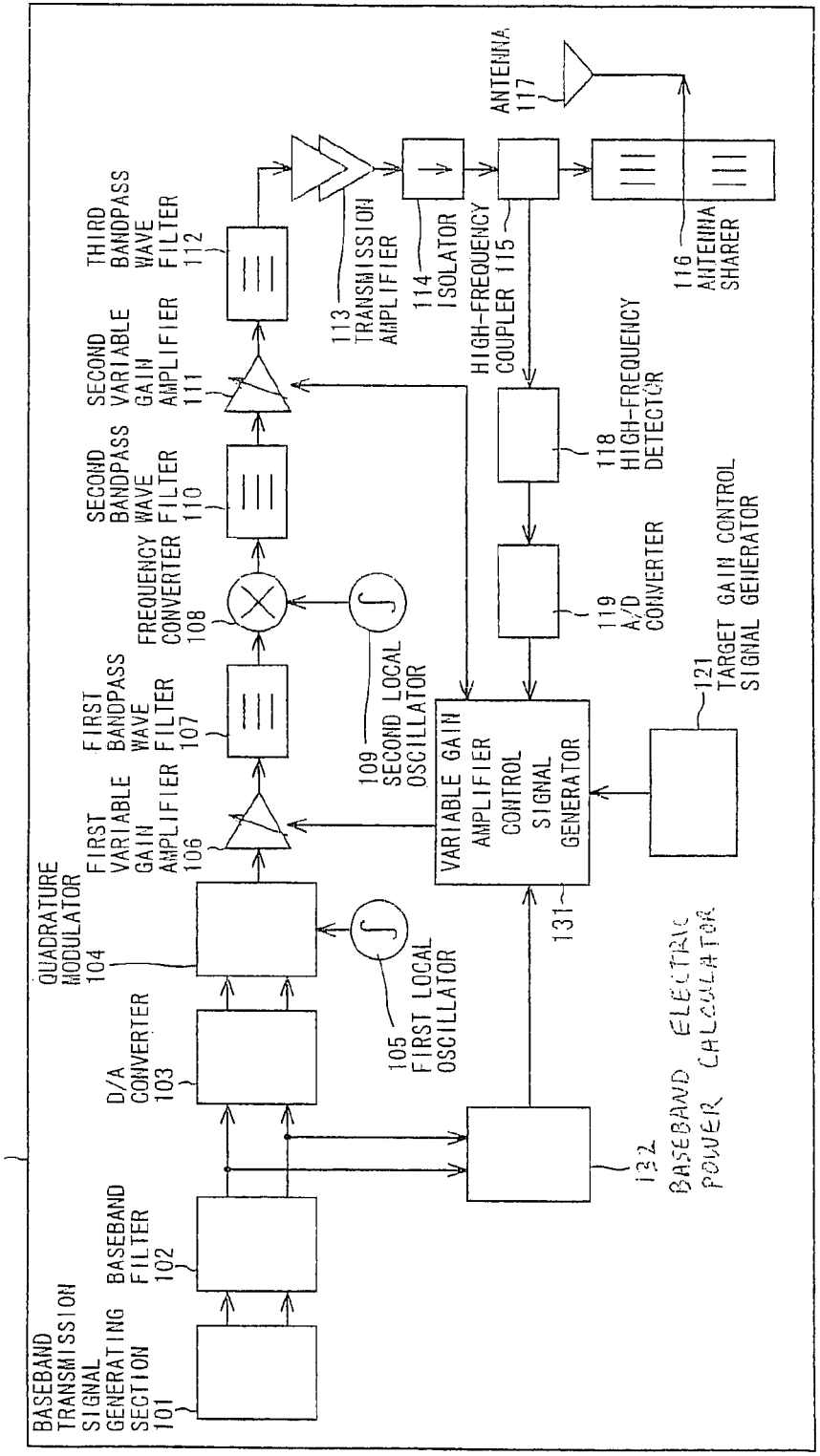
FIG. 3 is a block diagram showing a constitution of an embodiment of the present invention.

FIG. 3 is a block diagram showing a constitution of an embodiment of the present invention wherein components corresponding to those of a conventional example shown in FIG. 1 are designated by the same reference characters of FIG. 1.

A wireless transmitter 100 shown in FIG. 3 is used in a device for mobile station such as cellular phone and has a characteristic feature of compensating actual gain changes in an amplifying means.

The wireless transmitter 100 comprises a baseband signal generating section 101, a baseband filter 102, a D/A converter 103, a quadrature modulator 104, a first local oscillator 105, a first variable gain amplifier 106, a first bandpass wave filter 107, a frequency converter 108, a second variable gain amplifier 111, a third bandpass wave filter 112, a transmission amplifier 113, an isolator 114, a frequency coupler 115, an antenna sharer 116, an antenna 117, a high-frequency detector 118, an A/D converter 119, a target gain control signal generating section 121, a variable gain amplifier control signal generator 131, and a baseband electric power calculator 132.

The wireless transmitter 100 comprising the components 101 thorough 119, 121, 131, and 132 as described above is classified broadly into a wireless transmitting means and a transmitting electric power control means wherein the wireless transmitting means is composed of the components 101 through 117, while the transmitting electric power control means is composed of the components 118, 119, 121, 131, and 132.

In the wireless transmitting means, the baseband transmission signal generating section 101, the baseband filter 102, and the D/A converter 103 are connected by a baseband signal line of I-channel and Q-channel components (hereinafter simply referred to as "I- and Q-components") with each other.

An input end of the quadrature modulator 104 is connected to a baseband signal output end involving I- and Q-components of the D/A converter 103 and an output end of the first local oscillator 105, respectively. An intermediate frequency output end of the quadrature modulator 104 is connected to an intermediate frequency input end of the frequency converter 108 through the first variable gain amplifier 106, and the first bandpass wave filter 107.

A radio frequency input end of the frequency converter 108 is connected with an output end of the second local oscillator 109, while a radio frequency output end thereof is connected to the antenna 117 through the second bandpass wave filter 110, the second variable gain amplifier 111, the third bandpass wave filter 112, the transmission amplifier 113, the isolator 114, the high-frequency coupler 115, and the antenna sharer 116.

In the wireless transmitting means, input ends of the baseband electric power calculator 132 are connected to the baseband filter 102 and the A/D converter 103 with baseband transmission signal lines of I- and Q-components branched between the baseband filter 102 and the A/D converter 103, while an output end thereof is connected with a baseband electric power value input end of the variable gain amplifier control signal generator 131.

Furthermore, an input end of the high-frequency detector 118 is connected with an output end for high-frequency detection of the high-frequency coupler 115, while an output end thereof is connected with a transmitting electric power signal input end of the variable gain amplifier control signal generator 131 through the A/D converter 119.

A target gain signal input end of the variable gain amplifier control signal generator 131 is connected with an output end of the target gain control signal generating section 121, an intermediate frequency gain control signal output end thereof is connected with a gain amplification converting signal input end of the first variable gain amplifier 106, and a radio frequency gain control signal output end thereof is connected with a gain amplification converting signal input end of the second variable gain amplifier 111.

In the following, functions of the respective components 101 through 119, 121, 131, and 132 are described.

The baseband signal generating section 101 generates transmission signals to be transmitted from the present wireless transmitter 100. The baseband filter 102 applies bandwidth limiting to transmission signals (digital signals) from the baseband signal generating section 101. The D/A converter 103 converts digital signals passed through the baseband filter 102 into analog signals.

The quadrature modulator 104 frequency-converts transmission signals in baseband bandwidth from the D/A converter 103 into those of intermediate frequency bandwidth, and further, quadrature-modulates the transmission signals thus frequency-converted.

The first local oscillator 105 outputs local oscillation signals to be used for the quadrature modulator 104. The first variable gain amplifier 106 controls gains in response to intermediate frequency gain control signals from the variable gain amplifier control signal generator 131, and amplifies transmission signals from the quadrature modulator 104.

The first bandpass wave filter 107 allows only transmission signals of intermediate frequency bandwidth among those from the first variable gain amplifier 106 to pass through it. The frequency converter 108 frequency-converts transmission signals in intermediate frequency bandwidth, which have passed through the first bandpass wave filter 107, into those of radio frequency bandwidth. The second local oscillator 109 outputs local oscillation signals used for the frequency converter 108. The second bandpass wave filter 110 allows only transmission signals in radio transmission bandwidth from the frequency converter 108 to pass through it.

The second variable gain amplifier 111 controls gains in response to radio frequency gain control signals from the variable gain amplifier control signal generator 131, and amplifies transmission signals in radio transmission bandwidth passed through the second bandpass wave filter 110.

The third bandpass wave filter 112 allows only transmission signals in radio transmission bandwidth from the second variable gain amplifier 111 to pass through it. The transmission amplifier 113 amplifies transmission signals in radio transmission bandwidth passed through the second variable gain amplifier 111 to a predetermined transmitting electric power.

The isolator 114 allows transmission signals to pass through it in only a direction from the transmission amplifier 113 to the high-frequency coupler 115, and prevents signal passage in the reverse direction.

The high-frequency coupler 115 takes out transmission signals in the front end of the wireless transmitter 100. The antenna sharer 116 makes transmission and reception to be possible in the antenna 117.

The high-frequency detector 118 detects an output electric power of transmission signals from the high-frequency coupler 115.

The A/D converter 119 converts an analog value in electric power of transmission signals detected by the high-frequency detector 118 into a digital value (output electric power value=transmitting electric power value from the antenna 117).

The baseband electric power calculator 132 determines an electric power value (baseband electric power value) of baseband transmission signals in I- and Q-components from the baseband filter 102.

More specifically, a baseband electric power value corresponds to a total sum of electric power values of baseband transmission signals in I- and Q-components, and it is determined by the following equation (1):

$$\text{Baseband Electric Power Value} = \text{I-channel amplitude}^2 + \text{Q-channel amplitude}^2 \tag{1}$$

The variable gain amplifier control signal generator 131 adapts to set a condition in such that gains of the first and second variable gain amplifiers 106 and 111 come to be target gains in response to target gain control signals from the target gain control signal generating section 121 at the time of starting transmission, an observation gain is determined from an output electric power value from the A/D converter 119 and a baseband electric power value from the baseband electric power calculator 132 at the time of later transmission, and a signal for controlling gains of the first and second variable gain amplifiers 106 and 111 is generated in such that a difference between the observation gain and the target gain disappears.

The observation gain is determined by the following equation (2):

$$\text{Observation Gain} = \text{Output Electric Power Value}/\text{Baseband Electric Power Value} \quad (2)$$

The target gain control signal generating section 121 generates target gain control signals for setting target gains.

In the following, operations of the wireless transmitter having such constitution as described above are described.

At the time of starting transmission, the variable gain amplifier control signal generator 131 is set in such that gains of the first and second variable gain amplifiers 106 and 111 come to be target gains in response to target gain control signals from the target gain control signal generating section 121.

Thereafter, baseband transmission signals of I- and Q-components generated in the baseband transmission signal generating section 101 are input to the quadrature modulator 104 through the baseband filter 102 and the D/A converter 103 wherein the signals thus input are subjected to frequency conversion into transmission signals in intermediate frequency bandwidth in response to local oscillation signals from the first local oscillator 105, and further the signals frequency-converted are subjected to quadrature modulation.

The transmission signals in intermediate frequency bandwidth are amplified by the first variable gain amplifier 106 wherein target gains have been set at the time of starting transmission, the signals amplified are filtered by the first bandpass wave filter 107, and then, the signals filtered are frequency-converted into transmission signals in a radio frequency bandwidth in response to local oscillation signals from the second local oscillator 109.

The resulting transmission signals in radio frequency bandwidth are filtered by the second bandpass wave filter 110, the signals filtered are amplified in the second variable gain amplifier 111 wherein target gain have been set at the time of starting transmission, thereafter, the signals amplified are filtered with the third bandpass wave filter 112, and the signals filtered are amplified by the transmission amplifier 113. The transmission signals thus amplified are transmitted wirelessly to, for example, a base station (not shown) from the antenna 117 through the isolator 114, the high-frequency coupler 115, and the antenna sharer 116.

A transmitting electric power transmitted from the antenna 117 is detected by the high-frequency detector 118 via the frequency-coupler 115, an electric power of transmission signals detected in the form of analog value is converted into digital value (output electric power value), and the resulting value is input to the variable gain amplifier control signal generator 120.

Moreover, a baseband electric power value is determined by the baseband electric power calculator 132 on the basis of baseband transmission signals of I- and Q-components from the baseband filter 102, the value determined is input to the variable gain amplifier control signal generator 131.

In the variable gain amplifier control signal generator 131, an observation gain is determined from the output electric power value and the baseband electric power value, and intermediate frequency gain control signals are output to the first variable gain amplifier 106 in such that the observation gain becomes a target gain and radio frequency gain control signals are output to the second variable gain amplifier 111.

As described above, the wireless transmitter 100 according to the present embodiment is arranged in such that a baseband electric power value is determined on the basis of baseband transmission signals of I- and Q-components from the baseband filter 102 connected immediately after generating the baseband transmission signals of I- and Q-components, observation gains of the first and second variable gain amplifiers 106 and 111 connected between the baseband filter 102 and the antenna 117 are determined from the baseband electric power value and an output electric power value from the A/D converter 119 (transmission electric power value of the antenna 117) in the variable gain amplifier control signal generator 131, and gains of the first and second variable gain amplifiers 106 and 111 are controlled in such a manner that the observation gains become target gains from the target gain control signal generating section 121.

As a result, gains of the first and second variable gain amplifiers 106 and 111 connected at a predetermined position defined between the D/A converter 103 and the high-frequency coupler 115 are controlled at constant values, whereby a transmitting electric power from the antenna 117 can be controlled at a constant value.

As described above, gain, but not electric power is controlled so as to be constant in the present embodiment unlike a conventional ALC. Accordingly, when data transmission is stopped for the sake of, for example, achieving power saving in the case where no data to be transmitted, in other words, when only transmission in I-channel is stopped in the case where data signals are transmitted in the I-channel and control signals are transmitted in Q-channel, a control signal level in the Q-channel becomes constant, because gain is controlled so as to be constant, even if a transmission output value changes.

Furthermore, even when environmental variation such as changes in ambient temperature appears, gains can be made constant, since the gains of the first and second variable gain amplifiers 106 and 111 are controlled dependent upon observation gains, so that a transmitting electric power can be controlled constantly.

Such desirable control can be realized, even if characteristics vary not only in the first and second variable gain amplifiers 106 and 111, but also in connecting components between the D/A converter 103 and the high-frequency coupler 115, i.e., those between the D/A converter 103 and the antenna 117. This is because observation gain is determined from input/output signals between the D/A converter 103 and the antenna 117.

As described above, according to the present invention, a wireless transmitter wherein baseband transmission signals of I- and Q-components are amplified by a plurality of variable gain amplifying means via a modulating means for effecting digital/analog conversion and quadrature modulation of the baseband transmission signals, and then, the resulting signals are transmitted from an antenna is arranged in such that an electric power value of the above-described baseband signals to be input to the modulating means is determined, a transmission electric power value is determined after detecting transmission electric power of the antenna, observation gain is further determined from the electric power value and the transmission electric power value, and gains of a plurality of variable gain amplifying means are controlled in such that the observation gain comes to be a target gain.

Thus, a transmitting electric power in a control channel can be made constant irrespective of ON/OFF in an information channel such as sounds, and a transmitting electric power can be made also constant in case of temperature variation without employing any temperature detecting means.

The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A wireless transmitter wherein baseband transmission signals of I- and Q-components are amplified by a plurality of variable gain amplifying means via a modulating means for effecting digital/analog conversion and quadrature modulation of the baseband transmission signals, and then, the resulting signals are transmitted from an antenna, comprising:
   a calculation means for determining an electric power value of said baseband signals to be input to said modulating means;
   a detection means for determining a transmitting electric power value after detecting a transmitting electric power of said antenna;
   a generation means for generating target gains of said plurality of variable gain amplifying means; and
   a control means for determining observation gains from said electric power value and said transmitting electric power value to control the gains of said plurality of variable gain amplifying means in such that the observation gains come to be said target gains.

2. A device for mobile station, comprising:
   a wireless transmitter as claimed in claim 1.

3. A wireless transmitter wherein baseband transmission signals of I- and Q-components of said transmitter are amplified by a plurality of variable gain amplifiers via an digital/analog converter and a quadrature modulator of the baseband transmission signals, and then, the resulting signals are transmitted from an antenna, said transmitter comprising:
   a calculator that determines an electric power value of said baseband signals of said transmitter to be input to said modulator;
   a detector that determines a transmitting electric power value after detecting a transmitting electric power of said antenna;
   a generator that generates target gains of said plurality of variable gain amplifiers; and
   a controller that determines observation gains from said electric power value and said transmitting electric power value to control the gains of said plurality of variable gain amplifiers so that the observation gains become said target gains.

4. A wireless transmitter, comprising:
   a baseband transmission signal generating section that generates I- and Q-components;
   a digital/analog converter and a quadrature modulator of the baseband transmission signals that output signals that are transmitted from an antenna;
   a calculator that determines an electric power value of said baseband signals of said transmitter to be input to said quadrature modulator;
   a plurality of variable gain amplifiers that amplify a signal from said quadrature modulator;
   a detector that determines a transmitting electric power value after detecting a transmitting electric power of said antenna;
   a generator that generates target gains of said plurality of variable gain amplifiers; and
   a controller that determines observation gains from said electric power value and said transmitting electric power value to control the gains of said plurality of variable gain amplifiers so that the observation gains become said target gains.

5. The wireless transmitter as claimed in claim 4, wherein said electric power value=an I-channel amplitude$^2$ + a Q-channel amplitude$^2$.

6. The wireless transmitter as claimed in claim 4, wherein said observation gains=said transmitting electric power value/said electric power value.

* * * * *